United States Patent
Tutihashi

[11] 3,939,346
[45] Feb. 17, 1976

[54] GAIN PHOTO-CURRENT ENHANCEMENT METHOD

[75] Inventor: Simpei Tutihashi, Pittsford, N.Y.

[73] Assignee: Xerox Corporation, Stamford, Conn.

[22] Filed: Sept. 18, 1974

[21] Appl. No.: 507,044

[52] U.S. Cl. ................................................ 250/330
[51] Int. Cl.² ........................................ H01J 31/49
[58] Field of Search ............ 250/211 R, 213 R, 330, 250/331; 350/160 R, 160 LC

[56] References Cited
UNITED STATES PATENTS

| | | | |
|---|---|---|---|
| 3,069,551 | 12/1962 | Haine | 250/213 R |
| 3,732,429 | 5/1973 | Braunstein et al. | 250/213 R |

Primary Examiner—Davis L. Willis
Attorney, Agent, or Firm—James J. Ralabate; Michael H. Shanahan; George J. Cannon

[57] ABSTRACT

High quantum yields of gain photocurrent provided by sandwiching an insulating layer in contact with a photoconductor between two electrodes, applying an electrical potential thereacross, and directing excitation light upon the photoconductor are increased by simultaneously impinging the photoconductor with infrared radiation during exposure to the excitation light where the photoconductor comprises selenium or a selenium alloy. In cyclical operation of gain photocurrent devices having a photoconductive layer comprising selenium or a selenium alloy, fatigue effects are overcome by irradiation with infrared radiation.

30 Claims, 9 Drawing Figures

GAIN PHOTO-CURRENT ENHANCEMENT METHOD

BACKGROUND OF THE INVENTION

This invention relates to field induced injection currents across insulating layers and high quantum yields thereof when said insulating layer is in contact with a photoconductive layer and the photoconductive is struck by suitable light; more particularly, this invention relates to maintaining such high quantum yields in cyclical operation.

Light is physically viewed as possessing the characteristics of wave motion and energy particles. The characteristic of an energy particle is generally attributed to the photon quantum of light. Generally speaking, when a photon quantum of light strikes a photoconductive material, one pair of charge carriers constituting a negative charge and a positive charge is created. Typically, one of the charge carriers of the pair of charge carriers moves in the photoconductive material struck by the photon quantum of light while the other remains substantially in the location of creation. The negative charge carrier is generally referred to as an electron while the positive charge carrier is generally referred to as a hole. It has been found that when light strikes a photoconductive material, one photon quantum of light is required to generate one pair of charge carriers. Thus, the maximum quantum efficiency, expressed as number of pair of charge carriers created per photon quantum of light, has a maximum value of 1. Typically, the quantum efficiency is less than 1.

In order to obtain photoconductive gain greater than unity, it has been generally felt necessary that ohmic contact, e.g., a reservoir of charge at the metal-photoconductor interface, be present. It was further generally felt that with a blocking contact to the photoconductor, e.g., a non-ohmic contact with a Schottky energy barrier at the metal-photoconductor interface, photoconductive gains greater than unity could not be achieved. See, for example, "Photoconductive Gain Greater Than Unity in CdSe Films with Schottky Barriers at the Contacts", R. R. Mehta and B. S. Sharma, *J. Appl. Phys.*, Vol. 44, No. 1, January, 1973. According to this article, the authors were able to achieve a photoconductive gain greater than unity with gold electrodes in contact with the photoconductor wherein the gold contacts were determined to be non-ohmic with a Schottky energy barrier between the electrode and the photoconductor and wherein the radiation utilized was bandgap radiation of the photoconductor. No insulating layer was deliberately inserted between the gold electrode and photoconductor.

Conduction through a physical, electrically insulating barrier is reported in "Thermally Assisted Tunneling in Dielectric Films", G. G. Roberts and J. I. Polanco, *Phys. Stat. Sol. (a)*, 1,409 (1970). In the latter article, the authors reported findings in the characteristic relationship between current flow in, and voltage applied to, an insulating organic layer sandwiched between two electrodes. No photoconductive layer is utilized and no mention is made of gain photocurrent.

Conduction through a semiconductor layer adjacent a few-atoms-thin layers of insulating materials is theoretically presented in *The Physical Review B*, F, Schmidlin, 1, 4, pages 1583–1587 (1970).

U.S. Pat. No. 3,732,429 discloses the use of an inorganic insulating layer in contact with a photoconductor in order to obtain a higher dark impedance in conjunction with a liquid crystalline layer. All three layers are sandwiched between electrodes.

U.S. Pat. 3,709,683 discloses the use of infrared radiation in xerography to discharge positive charges or holes within vitreous selenium and selenium alloy photoconductors.

In new and growing areas of technology, new methods, apparatus, compositions, and articles of manufacture are often discovered for the application of the new technology in a new mode. The present invention relates to a new and advantageous method for maintaining high yields of gain photocurrent in cyclical operation and to a new and advantageous method for increasing maximum and equilibrium gain photocurrent in devices having photoconductive layers comprising selenium or selenium alloy.

SUMMARY OF THE INVENTION

It is, therefore, an object of the invention to provide a novel method for providing increased maximum gain photocurrent.

It is another object of this invention to provide a novel method for providing increased equilibrium gain photocurrent.

It is a further object of the invention to provide a novel method for cyclically providing gain photocurrent.

It is another object of this invention to provide a novel method for maintaining high yields of gain photocurrent.

It is still a further object of this invention to provide a gain photocurrent method which can be utilized with various imaging layers to enhance the imaging of said layers.

The foregoing objects and others are accomplished in accordance with this invention by irradiating an insulating layer in contact with a photoconductive layer comprising selenium or a selenium alloy, with infrared radiation. The ratio of photoconductive layer thickness to insulating layer thickness being at least about 10 to 1. Increased maximum gain photocurrent and increased equilibrium gain photo current are provided when the infrared radiation strikes the photoconductor simultaneously with the excitation light normally used to provide gain photocurrent.

Fatigue effects leading to diminishing gain photocurrent in cyclical operation of gain photocurrent devices containing selenium or a selenium alloy, are overcome by irradiating the device with infrared radiation either continuously, or in between cycles of gain photocurrent production.

BRIEF DESCRIPTION OF THE DRAWINGS

For a better understanding of the invention as well as other objects and further features thereof, reference is made to the following detailed disclosure of the preferred embodiments of the invention taken in conjunction with the accompanying drawings thereof, wherein.

DESCRIPTION OF THE PREFERRED EMBODIMENTS

Gain Photocurrent Device

Figure 1:
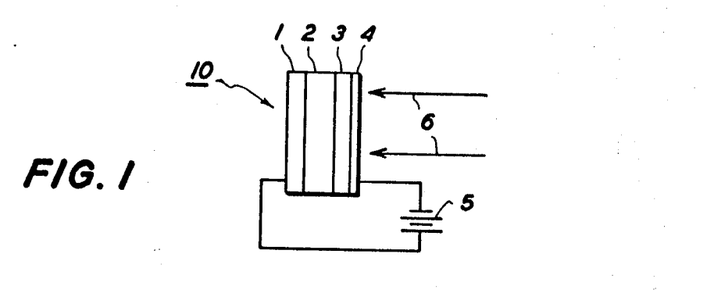
FIG. 1 is a schematic illustration of a typical device which provides gain photocurrent.

Referring now to FIG. 1, the gain photocurrent device or electrical switching device the operation of which is enhanced by the present invention is generally represented as 10. The device comprises electrodes 1 and 4, insulating layer 2 and photoconductive layer 3, layer 3 being at least about ten times as thick as layer 2.

Electrodes 1 and 4 may comprise any suitable material which allows the provisioning from voltage source 5 of a potential across insulating layer 2 and photoconductive layer 3. Typical suitable materials include metals such as platinum, silver, tin, aluminum, gold, copper, indium, gallium; conductive metal oxides such as, for example, tin oxide, indium oxide; insulating substrates coated with conductive layers such as NESA glass comprising a thin coating of tin oxide over glass and commercially available from Pittsburgh Plate and Glass Company. Any suitable electrode material can be utilized. However, in particularly preferred embodiments of the invention the characteristics of the photoconductive layer, electrodes and insulating layer are matched in order to provide maximum gain in photocurrent, and the work function of the electrode is selectively chosen to match the characteristics of the photoconductive layer and the insulating layer. "Work function" or derivations thereof is used herein in the conventional sense well known to those skilled in the art; and "high work function" is used herein to designate materials which have a work function at or above 4.5 eV while "low work function" is used herein to refer to materials which have a work function below about 4.5 eV. Any suitable insulating layer can be utilized in the present invention. Such layers may include insulating inorganic materials such as, for example, metallic oxides which are nonconductive and may include insulating organic materials. Any suitable insulating organic material may be used. Typical insulating organic materials include: poly(2-propene-anthracene), poly(2-vinyl-anthracene), poly[1-(2-anthryl)ethylmethacrylate], phenoxy resin — a high molecular weight thermoplastic copolymer of bisphenol A and epichlorohydrin having the basic molecular structure — $[OC_6H_4C(CH_3)_2C_6H_4OCH_2CH(OH)CH_2]_n$ where $n$ is equal to about 100 (the foregoing material being representative of insulating materials having a low ionization potential of below about 8 eV) polystyrene, polyvinylcarbazole, polyethylene, polycarbonate resins such as, for example, LEXAN — a thermoplastic carbonate linked polymer produced by reacting bisphenol A with phosgene, available from General Electric Company, the various parylenes such as poly-para-xylylene and poly-monochloro-paraxylylene, a 65/35 weight percent copolymer of styrene and n-butylmethacrylate, a 70/30 weight percent copolymer of styrene and hexylmethacrylate (the foregoing being representative of insulating materials having "high" electron affinity above about 1.5 eV).

It will be understood, of course, that any suitable insulating layer may be used regardless of the value of its ionization potential. However, for particularly preferred embodiments mentioned above and which will be described below, the ionization characteristics of the material utilized in the insulating layer 2 is appropriately matched with the characteristics of the photoconductive layer and the work function of the electrodes. Other typical suitable insulating material for insulating layer 2 include: classes of materials such as poly-styrenes, alkyd substituted polystyrenes, polyolefins, styrene acrylic copolymers, styrene-olefin copolymers, silicone resins, phenolic resins, and organic amorphous glasses. Typical suitable materials include Staybelite Ester 10, a partially hydrogenated rosin ester, Foral Ester, a hydrogenated rosin triester, and Neolyn 23, an alkyd resin, all from Hercules Powder Co., SR 82, SR 84, silicone resins, both obtained from General Electric Corporation; Velsicol X-37, a polystyrene-olefin copolymer from Velsicol Chemical Corp.; hydrogenated Piccopale 100, a highly branched polyolefin, HP-100, hydrogenated Piccopale 100, Piccotex 100, a copolymer of methyl styrene and vinyl toluene, Piccoelastic A-75, 100 and 125, all polystyrenes, Piccodiene 2215, a polystyreneolefin copolymer, all from Pennsylvania Industrial Chemical Co., Araldite 6060 and 6071, epoxy resins of Ciba; Amoco 18, a poly alpha-methylstyrene from Amoco Chemical Corp.; ET-693 and Amberol ST, phenol-formaldehyde resins, ethyl cellulose, and Dow C4, a methylphenylsilicone, all from Dow Chemical; R5061A, a phenylmethyl silicone resin, from Dow Corning,; Epon 1001, a bisphenol epichlorohydrin epoxy resin, from Shell Chemical Corp.; and PS-2, PS-3, both polystyrenes, an ET-693, a phenol-formaldehyde resin, from Dow Chemical; and Nirex 1085 a polyterpene resin, available from Tenneco Corporation under that tradename.

For the present invention, photoconductive layer 3 may comprise any suitable selenium or selenium alloy photoconductive material. Typical suitable selenium containing photoconductive materials include selenium, selenium alloyed with arsenic such as, for example, arsenic triselenide, and selenium alloyed with tellurium, antimony, or bismuth. Typical suitable selenium containing photoconductive materials are listed in U.S. Pat. No. 3,121,006 to Middleton et al. and in U.S. Pat. No. 3,288,603, both of which patents are hereby incorporated by reference. The thickness of the photoconductive layer 3 is not critical to the practice of the invention and any thickness which provides gained photocurrent may be utilized.

As previously stated, any combination of material for electrodes 1 and 4 and insulating layer 2 with selenium-containing photoconductive layer 3 may be utilized to obtain gain photocurrent in accordance with the present invention. However, enhanced results are obtained when the characteristics of the electrodes and insulating layer are matched to the selenium-containing photoconductive layer. Since selenium-containing photoconductive materials preferentially conduct positive charge or holes to a greater extent than they conduct negative charge or electrons, the electrode material is preferentially selected to have a high work function greater than about 4 eV and the insulating layer preferentially has a low ionization potential of below about 8 eV.

It has been found through experimentation that gain photocurrent is obtained when the thickness ratio of photoconductive layer to insulating layer is at least about 10 to 1, or greater. In operation, a voltage is applied from voltage source 5 and excitation light 6 is directed upon the device.

Figure 2:
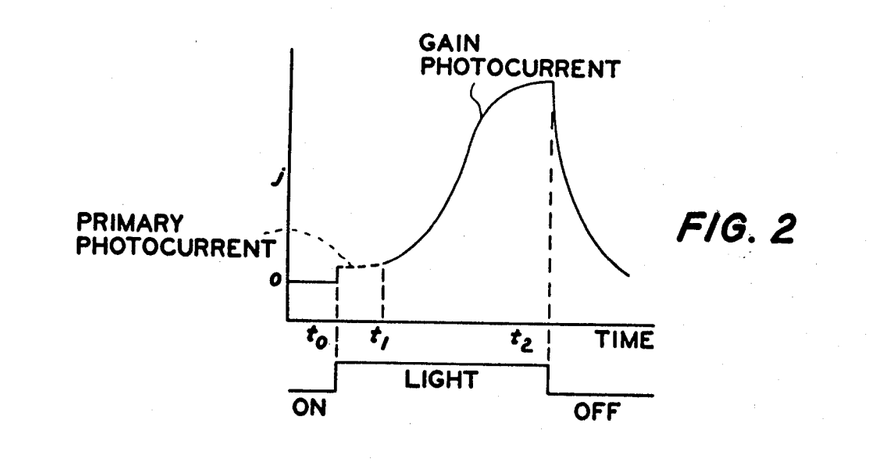
FIG. 2 is a graphical illustration of a representative plot of the behavior of photocurrent versus time in relation to excitation light which occurs during the utilization of the gain photocurrent device of FIG. 1.

FIG. 2 generally illustrates the typical observed photocurrent behavior in time in conjunction with the excitation light. At time equal $t_o$, the excitation light is turned on and one observes a steady state primary photocurrent. At time equal $t_1$, the photocurrent goes into the gain mode and then grows until it reaches a maximum gain current. At time equal $t_2$, the excitation light is turned off; the current decreases, eventually returning back to the dark current level. With repetitive experimentation, it was determined that for any particular device, the quantity or total charge conducted through the photoconductor before the onset of the gain photocurrent or secondary current is substantially constant and substantially independent of excitation light and applied voltage. Listed below in Table I is a tabulation of the results obtained on a device having an about 8μm thick arsenic triselenide photoconductive layer and an about 100A phenoxy insulating layer under an applied voltage across the device of about 120V. The wavelength of excitation light utilized was at about 498 nm. The only parameter varied was that of incident light flux.

As can be seen from Table I, the total charge or quantity of charge conducted through the photoconductor prior to onset of the secondary or gain photocurrent is substantially constant and is independent of the excitation light intensity. It will be appreciated, of course, that the excitation light is one having a wavelength within the fundamental absorption band of the photoconductor and which excites a primary photocurrent in the photoconductor. In addition to being independent of the excitation light intensity, the total charge going through the photoconductor prior to the onset of the secondary current was also determined to be independent of the applied voltage and insulating layer thickness. Additionally,

TABLE I

| Incident Light Flux (photons/cm²-sec) | Primary Current (μA/cm²) | $t_1 - t_o$ (sec) | Pre-Gain Total Charge (μC/cm²) |
|---|---|---|---|
| 9.26 × 10¹¹ | 0.12 | 4.90 | 0.59 |
| 1.77 × 10¹² | 0.21 | 2.84 | 0.60 |
| 2.80 × 10¹² | 0.32 | 1.82 | 0.58 |
| 5.33 × 10¹² | 0.52 | 1.10 | 0.57 |
| 8.45 × 10¹² | 0.91 | 0.67 | 0.61 |
| 1.61 × 10¹³ | 1.46 | 0.42 | 0.61 | this quantity of total charge was found to be only moderately dependent on the identity of the photoconductive material in photoconductor layer 3. The substantially constant nature of this total charge applied for any one given device and is found to vary somewhat from one particular device to another, even with identical materials for the insulating layer, electrode materials and photoconductive layer.

As can be seen from the FIG. 2 illustration, the secondary photocurrent gives a gain greater than unity. This portion of the photocurrent is typically referred to, and is herein denoted, gain photocurrent. Phenomenologically, it is theorized that as excitation light excites the photoconductor and thereby creates a pair of charge carriers, the positive charge moves towards the negative electrode and the negative charge moves towards the positive electrode. All charges of one polarity exit from the photoconductor into the electrode with which it is in ohmic contact and all charges of the other polarity move toward the insulating layer and build up at the interface between the photoconductor layer and the insulating layer with which it is in contact. At time $t_1$, the total charge at the interface is sufficient to create a critical electrical field across the insulating layer. At this point, charge injection into the conduction band (or valence band, depending upon charge carrier polarity) of the insulating material through thermally assisted tunneling becomes significant. The velocity of the tunneling charges is very high, so the probability of recombination with charges of opposite polarity is small. As the excitation light keeps generating more charges at the interfaces, the electrical field across the insulating layer increases. This makes the insulating layer more transparent to tunneling charges, and the gain current increases until the generation and recombination of charges reach equilibrium. Experimental results are in general agreement with this theory and revealed that for any particular device the maximum gain photocurrent increases proportionally to the square of the voltage applied across the device.

The tabulated data in Table II demonstrates that the maximum gain photocurrent varies significantly with the work function of the electrodes. These data were taken on a device comprising an about 8μm thick layer of arsenic triselenide as the photoconductive layer and an about 100A thick phenoxy layer as the insulating layer. The applied voltage was at a strength of about $10^5$ V/cm, the excitation light incident on the device was at a wavelength of about 454 nm and at a flux of about $2 \times 10^{12}$ photons/cm²-sec. Table II also further illustrates the general statement previously made that the characteristics of the photoconductor layer, insulating layer and electrodes should be matched in order to obtain even larger gain photocurrents.

TABLE II

| Electrode Material | Maximum Gain Photocurrent (A/cm²) | Work Function (eV) |
|---|---|---|
| Aluminum | 2.7 × 10⁻⁷ | 4.0 |
| Silver | 5.2 × 10⁻⁷ | 4.3 |
| Copper | 6.0 × 10⁻⁷ | 4.6 |
| Tin Oxide | 1.5 × 10⁻⁶ | 4.8 |
| Gold | 1.6 × 10⁻⁶ | 5.0 |

It will be noted that the photoconductive material utilized in the device from which the Table II data was obtained was arsenic triselenide, an alloyed photoconductor, which we indicated typically preferentially conducts positive charge or holes. Accordingly, we previously indicated that where the photoconductive material exhibited this characteristic, the electrode material should be selected to have a high work function. From Table II it can be seen that the higher the work function of the electrode material, the higher the maximum gain, photocurrent.

Referring again to FIG. 2, it can be seen that operation of gain photocurrent device presents an electrical switch in which the gain photocurrent is provided subsequent to turn-on of the excitation light and is extinguished subsequent to the turn-off of the excitation light. Accordingly, the gain photocurrent leads itself very conveniently to the utilization of imaging layers, materials and systems which utilize either electrical fields, charge injection, or current flow in their imaging scheme.

Figure 3:
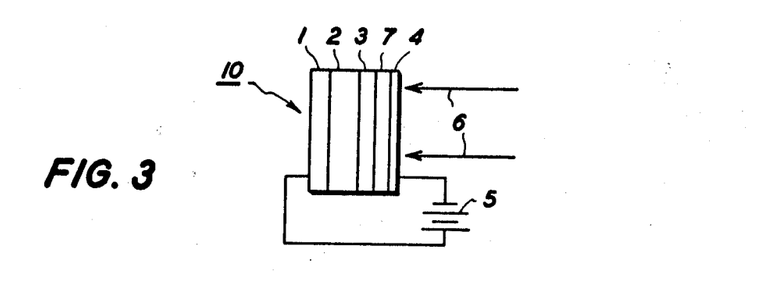
FIG. 3 is a schematic illustration of the gain photocurrent device used in conjunction with an imaging layer to enhance the imaging of said layer.

FIG. 3 schematically illustrates one embodiment wherein the gain photocurrent device includes an imaging layer 7. It can be seen from FIG. 3 that the device structure is in all respects identical with that of FIG. 1 except that an imaging layer 7 is sandwiched between photoconductor layer 3 and electrode 4. In the embodiment schematically illustrated by FIG. 3, imaging layer 7 can conveniently by any suitable layer of material or combination of materials. For example, imaging layer 7 can be a liquid crystalline composition which exhibits dynamic scattering in the areas of current flow. In this case, the configuration of the current flow or gain photocurrent from the photoconductor and through the liquid crystalline material of imaging layer 7 will determine the areas of imaging layer 7 which exhibit dynamic scattering. Electrodes 1 and 4 can be shaped in image configuration in order to provide imagewise configured gained photocurrent; or, alternatively, the exciting light can be in imagewise configuration thereby causing the gain photocurrent to be exhibited in portions of imaging layer 7 corresponding to the portions of photoconductive layer 3 struck by the excitation light.

For a more detailed description of liquid crystalline material, methods, apparatus and utilizations wherein light can be diffusely scattered, or dynamically scattered to thereby provide imaging, see U.S. Pat. Nos. 3,592,527; 3,722,998 and 3,761,172, hereby expressly incorporated by reference. Speaking generally, such liquid crystalline materials comprise nematic mesophases and mixtures of nematic and cholesteric mesophases wherein an applied voltage causes the selective diffusing and scattering of the selectively transmitted and reflected light.

Imaging layers and systems suitable for use in conjunction with the gain photocurrent device of the present invention include any imaging layer or system which can be imaged by application of voltage which subjects the layer to either an electrical field, current or charge carrier flow, or the capture of charges such as, for example, that of U.S. Pat. No. 3,645,729, hereby incorporated by reference.

Imaging layer 7 may comprise any suitable display layer such as, for example, electrochromic displays. Such displays are readily known to those skilled in the art and will not be described in detail herein. Such displays include selective electroplating, pH changes in chemical compounds leading to a color change, reduction-oxidation reactions such as, for example, the formation of oxides of the transition metals, and a whole host of materials the optical properties of which change as a result of electric charge being trapped by said materials.

Typical suitable liquid crystalline fieldeffects include, for example, the optically negative to optically positive phase transformation disclosed in U.S. Pat. No. 3,652,148 hereby incorporated by reference; the twisted nematic to nematic transformation disclosed in U.S. Pat. No. 3,731,986, hereby incorporated by reference; the Grandjean to focal-conic texture transforamtion disclosed in U.S. Pat. No. 3,642,348, hereby incorporated by reference; and, the nematic field-effects such as, for example, the uniaxial to biaxial transformation disclosed in U.S. Pat. 3,687,515, hereby incorporated by reference. Generally speaking, liquid crystalline field-effects are obtained in accordance with the practice of the present invention provided (1) the photoconductor has a dark resistance sufficiently greater than that of the liquid crystalline material such that the electrical field which resides across the liquid crystalline material in the dark is below that required for imaging, and (2) in the presence of light, the resistance of the photoconductor is decreased to a value sufficiently low such that an electrical field is produced across the liquid crystalline material sufficient to produce the field-effect.

It will be readily appreciated by those skilled in the art that the gain photocurrent decreases the amount of light otherwise required for the imaging of such displays and additionally provides more current during the interval $t_1$ and $t_2$ than would otherwise be the case in the absence of the gain photocurrent provided by the practice of the present invention.

Further, it is noted that the voltage source 5 in FIGS. 1 and 3 is schematically illustrated as a D.C. voltage source. The advantageous gain photocurrent according to the practice of the present invention is provided only by the utilization of a direct current voltage source. An alternating current voltage source does not provide the gain photocurrent of the present invention because the oscillation of charges does not result in the sufficient accumulation of charge and does not yield a sufficient electrical field across the insulating layer at $t_1$ (FIG. 2) for gain photocurrent. The poles of voltage source 5 are electrically connected to the electrodes 1 and 4 in a manner that causes the more mobile charge carrier of the charge carrier pairs created by excitation light impinging the photoconductive layer to move away from the insulating layer. That is, in FIGS. 1 and 3, the polarity is connected such that the mobile charge carrier moves away from electrode 1 and towards electrode 4. Thus, when the photoconductor utilized preferentially conducts positive charge then the negative polarity of voltage source 5 is connected to electrode 4.

The following examples further specifically illustrate various preferred embodiments of the gain photocurrent device. Parts and percentages are by weight unless otherwise indicated.

EXAMPLE I

A gain photocurrent device representative of that of FIG. 1 is prepared as follows:

A glass substrate overcoated with a thin, transparent indium oxide conductive layer is utilized as electrode 1. The electrode is prepared by cleaning with a solution of Alcanox in an ultrasonic bath for about 30 minutes. This cleaning is followed by an about 5 minute rinsing in running hot water and then in an about 5 minute rinsing in running deionized water. The electrodes are subsequently air-dried for 1 hour in an oven at about 60°C.

A phenoxy insulating layer is next applied over the indium oxide layer of one of the electrodes by dip coating. The thickness of the phenoxy layer is controlled by varying the concentration of a phenoxy resin solution comprising 2-methoxyethyl acetate and methyl ethyl ketone. A 1 to 1 volume ration of the two solvents is utilized and the phenoxy resin is added in an amount which constitutes about 0.3 weight percent of the resulting solution. The electrode to be coated is dipped in the solution and withdrawn at a rate of about 5.6 centimeters per minute. The resulting thickness of the phenoxy insulating layer is determined by multiple beam interferrometry, transmission electron microscopy, and U.V. absorption measurements to be about 100A.

An arsenic triselenide photoconductive layer is then deposited over the phenoxy insulating layer by vacuum evaporation. The phenoxy coated electrode is first baked out in a vacuum of about $1 \times 10^{-5}$ Torr by radiation heating at about 85 to about 90°C. for about 1 hour. The arsenic triselenide is evaporated from a "Knudsen cell" type tantalum boat. The thickness of the photoconductor layer is controlled by the amount of photoconductive material placed in the boat. A revolving wheel to which the phenoxy coated electrode is attached is utilized during evaporation to ensure uniform thickness of the resulting photoconductor layer. During evaporation of the arsenic triselenide, the temperature of the phenoxy coated electrode is maintained at about 45° to about 50°C in order that the resulting photoconductive layer of arsenic triselenide has good appearance and mechanical properties. The amount of arsenic triselenide placed in the boat is such that the resulting photoconductive layer has a thickness of about 8μm, determined by multiple beam interferrometric measurements. Subsequently, a gold electrode is evaporated onto the free surface of the arsenic triselenide layer. The gold electrode in contact with the photoconductive layer is then connected to the negative terminal of a variable D.C. voltage source and the positive terminal thereof is connected to the electrode in contact with the phenoxy insulating layer.

EXAMPLE II

The procedure of Example I was followed to form gain photocurrent devices each of which comprised an insulating layer material different from that of other sample devices. In each of the sample devices, the electrodes are gold with the gold electrode adjacent the insulating layer being semi-transparent and about 50% transmissive to light whereas the gold electrode in contact with the photoconductive layer has a thickness of about 2000A. In all samples, the incident light is at a wavelength of about 454 nm and at a flux of about $4.58 \times 10^{11}$ photons/cm$^2$-sec; the photoconductive layer is arsenic triselenide and is about 10 microns thick; the insulating layer thicknesses are between about 200 and about 300A.

TABLE III

| Insulating Layer Material | $\sqrt{E} \times 10^{-2}$(V/cm)$^{1/2}$ where E = field across the insulating layer | Gain Photocurrent (A/cm$^2$) |
| --- | --- | --- |
| Phenoxy | 5.4 | $1 \times 10^{-8}$ |
| Phenoxy | 9.2 | $7.5 \times 10^{-8}$ |
| Phenoxy | 13.9 | $4 \times 10^{-7}$ |
| poly(2-propene-2-anthracene) | 6.2 | $3.1 \times 10^{-8}$ |
| poly(2-propene-2-anthracene) | 7.8 | $2.9 \times 10^{-7}$ |
| poly(2-propene-2-anthracene) | 8.8 | $1.3 \times 10^{-6}$ |
| poly(2-vinyl-anthracene) | 5.3 | $3.5 \times 10^{-8}$ |
| poly(2-vinyl-anthracene) | 7.9 | $3.5 \times 10^{-8}$ |

TABLE III-continued

| Insulating Layer Material | $\sqrt{E} \times 10^{-2}$(V/cm)$^{1/2}$ where E = field across the insulating layer | Gain Photocurrent (A/cm$^2$) |
| --- | --- | --- |
| poly(2-vinyl-anthracene) | 8.7 | $8 \times 10^{-7}$ |

The above data is representative of that obtained from a whole host of experiments on the three above-identified materials for the insulating layer. It is seen from the above representative data that the gain photocurrent does vary with the identity of the insulating material utilized in the insulating layer of the gain photocurrent device.

EXAMPLE III

The procedure of Example I is followed to produce a gain photocurrent device having the gold electrodes of Example II and a phenoxy insulating layer of a thicknes of between 200 to about 300A. The gain photocurrent is measured as a function of the temperature at which the gain photocurrent device is maintained. The following data are representative of the data obtained.

TABLE IV

| $E \times 10^{-2}$(V/cm)$^{1/2}$ | Temperature (°K) | Gain Photocurrent (A/cm$^2$) |
| --- | --- | --- |
| 2 | 277.7 | $8.5 \times 10^{-10}$ |
| " | 294.1 | $3.4 \times 10^{-9}$ |
| " | 313.2 | $1.8 \times 10^{-8}$ |
| 10 | 277.7 | $3.7 \times 10^{-8}$ |
| " | 294.1 | $9.3 \times 10^{-8}$ |
| " | 313.2 | $2.8 \times 10^{-7}$ |
| " | 330.2 | $1.4 \times 10^{-6}$ |
| 14 | 277.7 | $2.5 \times 10^{-7}$ |
| " | 294.1 | $4.7 \times 10^{-7}$ |
| " | 313.2 | $1.1 \times 10^{-6}$ |
| " | 330.2 | $4.3 \times 10^{-6}$ |

The above representative data show that the gain photocurrent is dependent upon temperature.

EXAMPLE IV

The procedure of Example I and the electrodes and photoconductive layer of Example III are utilized in fabricating gain photocurrent device samples. In each sample, however, the insulating material is varied. An applied electrical field of about $1.5 \times 10^5$ V/cm is applied to each sample and the excitation light is at a wavelength of 454 nm and at a flux of about $1.05 \times 10^{13}$ photons/cm$^2$-sec.

TABLE V

| Insulating Layer Material | Insulating Layer Thickness (A) | Gain Photocurrent (A/cm$^2$) |
| --- | --- | --- |
| Polyvinyl carbazole | 250 | $10^{-5}$ |
| A 70/30 weight percent copolymer of styrene and hexylmethacrylate | 913 | $5.6 \times 10^{-6}$ |
| A 65/35 weight percent copolymer of styrene and n-butylmethacrylate | 653 | $9 \times 10^{-6}$ |
| LEXAN | 803 | $4.5 \times 10^{-6}$ |
| polystyrene | 845 | $4.5 \times 10^{-6}$ |

The above data demonstrate that the gain photocurrent does vary with the identity of the insulating material. A comprehensive review of all of the data obtained, however, demonstrates that the amount of gain photocurrent is not substantially affected by the thickness of the insulating layer for any given identity of insulating material utilized in the insulating layer.

EXAMPLE V

Experiments were conducted to determine whether the excitation light intensity had an effect on the gain photocurrent obtained. The procedure of Example I was followed to provide a gain photocurrent device having the gold electrodes of Example III and comprising a phenxoy insulating layer at a thickness of about 6500A, and a selenium photoconductive layer at a thickness of about 25 microns. The excitation light was at a wavelength of about 454 nm. The photon flux of the excitation light was varied and the primary and gain photocurrents observed were as follows: at a flux of $4 \times 10^{11}$ photons/cm$^2$-sec the primary current is measured to be about $4 \times 10^{-8}$ amps/cm$^2$ while the gain photocurrent is measured to be about $2.5 \times 10^{-7}$ amps/cm$^2$; at a flux of about $1.5 \times 10^{12}$ photons/cm$^2$-sec the primary current was measured to be about $10^{-7}$ amps/cm$^2$ and the gain photocurrent was measured to be about $5 \times 10^{-7}$ amps/cm$^2$; at a flux of about $4 \times 10^{12}$ photons/cm$^2$-sec the primary current was measured to be about $3 \times 10^{-7}$ amps/cm$^2$ and the gain photocurrent was measured to be about $1.5 \times 10^{-6}$ amps/cm$^2$; and, at a flux of about $1.2 \times 10^{13}$ photons/cm$^2$-sec the primary current was determined to be about $8 \times 10^{-7}$ amps/cm$^2$ and the gain photocurrent was determined to be about $3.5 \times 10^{-6}$ amps/cm$^2$.

These data show a linear relationship between gain photocurrent and excitation light flux for a selenium photoconductive layer.

EXAMPLE IV

The procedure of Example I is utilized to provide a gain photocurrent device having the gold electrodes of Example III and comprising a phenoxy insulating layer at a thickness of about 100A and an arsenic triselenide photoconductive layer at a thickness of about 8 microns. The applied electrical field is at about $1.5 \times 10^5$ V/cm and the excitation light is at a wavelength of about 498 nm. The primary current and gain photocurrent were measured as a function of varying excitation light flux. The following data are representative of the data obtained: at a flux of about $10^{12}$ photons/cm$^2$-sec, the primary current was measured to be about $1.3 \times 10^{-7}$ amps/cm$^2$ and the gain photocurrent was measured to be about $1.8 \times 10^{-6}$ amps/cm$^2$; at a flux of about $8 \times 10^{12}$ photons/cm$^2$-sec, the primary current was measured to be about $9 \times 10^{-7}$ amps/cm$^2$ and the gain photocurrent was observed to be about $6.5 \times 10^{-6}$ amps/cm$^2$; and, at a flux of about $1.6 \times 10^{13}$ photons/cm$^2$-sec the primary current was measured to be about $1.5 \times 10^{116\ 6}$ amps/cm$^2$ and the gain photocurrent was measured to be about $1.8 \times 10^{-6}$ amps/cm$^2$.

A comprehensive review of the complete set of data indicates that for arsenic selenide the primary current varies linearly with the flux or intensity of the excitation light but that the gain photocurrent is proportional to the square root of the light intensity. It is further indicated, as one skilled in the art might expect, that the gain photocurrent varied with the identity of the photoconductive material. For example, it is noted that the arsenic triselenide photoconductive layer provides about four times as much gain photocurrent as the selenium photoconductive layer although its electrical field is only about ½ the strength of that utilized in the device containing the selenium photoconductive layer. This is not attributable to the difference in thicknesses between the phenoxy insulating layers utilized in the two gain photocurrent devices as will be seen in Example VII, below.

EXAMPLE VII

The procedure of Example I is utilized to provide gain photocurrent devices having the gold electrodes of Example III, phenoxy insulating layers of various thicknesses, and a photoconductive layer thickness of about 6 microns. Two sets of samples are made wherein the first set comprises arsenic triselenide and the second set comprises selenium, as the photoconductive layers. Each set of devices contains phenoxy insulating layers varying from about 10 to about 7000A in thickness. The first set of devices containing the arsenic triselenide photoconductive layer have an electrical field applied at a strength of about $1.5 \times 10^5$ V/cm whereas the second set of devices comprising the selenium photoconductive layers have an electrical field applied at a strength of about $4 \times 10^5$ V/cm. The excitation light utilized in operating both sets of devices is at a wavelength of about 454 nm and at a flux of about $1.05 \times 10^{13}$ photons/cm$^2$-sec. Gain photocurrent is observed in the arsenic triselenide devices for phenoxy layers ranging from about 10 to about 3000A in thickness and the measured gain photocurrent is observed to be within the range from about $4 \times 10^{-6}$ to about $2 \times 10^{-5}$ amps/cm$^2$ and therefore varies little over a wide range of insulator thicknesses. It is especially noteworthy that gain photocurrent is observed in the arsenic triselenide devices with an insulation layer as thick as 2500A.

The set of devices containing selenium photoconductive layers exhibit photocurrent gain with insulating layers having thicknesses from about 60 to about 7000A.

The gain photocurrent is measured for these thicknesses to be within the range from about $2.8 \times 10^{-6}$ to about $7 \times 10^{-6}$ amps/cm$^2$. Again, the gain photocurrent varies little over a wide range of insulator thicknesses. Again, it is especially noteworthy that gain photocurrent was observed in devices comprising the selenium photoconductive layer and having insulating layer thicknesses as great as about 7000A.

EXAMPLE VIII

The procedure of Example I is followed to provide gain photocurrent devices for studying the effect of an applied electrical field on the resulting gain photocurrent. The devices comprise an indium oxide coated glass substrate as a semi-transparent anode overcoated with an about 400A thick phenoxy insulating layer which, in turn, is coated with an about 6.2 micron thick arsenic triselenide photoconductive layer. The cathode in contact with the photoconductive layer is an aluminum electrode. During operation of the devices, excitation light at a wavelength of about 454 nm and at a flux of about $1.05 \times 10^{13}$ photons/cm$^2$-sec is utilized. The voltage, and therefore, the applied field, is set at variable settings and at each setting the resulting measured primary current and gain photocurrent are measured. The primary current tends to saturate at approximately $1.1 \times 10^{-6}$ amps/cm$^2$, corresponding to a quantum efficiency of about 0.73. The gain photocurrent shows no sign of saturation and increases proportionally to the square of the applied electrical field. Data representative of the complete set of data upon which the foregoing observations were made include the following: at an applied field of about $4 \times 10^4$ volts/cm, the measured primary current is $7 \times 10^{-7}$ amps/cm$^2$ and the gain photocurrent is measured to be about $1.3 \times 10^{-6}$ amps/cm$^2$; at an applied electrical field strength of about $10^5$ V/cm, the primary current is measured at about $10^{-6}$ amps/cm$^2$ and the gain photocurrent is measured to be about $7.5 \times 10^{-6}$ amps/cm$^2$; and, at an applied field strength of about $2 \times 10^5$ V/cm, the primary current is measured to be about $10^{-6}$ amps/cm$^2$ and the gain photocurrent is measured to be about $3 \times 10^{-5}$ amps/cm$^2$.

EXAMPLE IX

The embodiment in FIG. 3 is prepared by following the procedure of Example I to provide an imaging device comprising the indium oxide coated electrode of Example VIII overcoated with a phenoxy insulating layer at a thickness of about 100A, the phenoxy insulating layer being overcoated with an about 8.5 micron thick arsenic triselenide photoconductive layer. Another indium oxide coated conductive glass is placed face to face on the aforementioned photoconductive layer with an air-gap of about 13μm. The air gap is then filled with cholesteric liquid crystal and sealed with epoxy resin. A voltage of about 100 volts is applied to the device with the second electrode electrically connected to the negative terminal of the voltage source and the first indium oxide coated electrode connected to the positive terminal of the voltage source. The voltage source is a D.C. voltage. The cholesteric liquid crystalline composition utilized in the liquid crystalline layer comprises 80 weight precent pmethoxy-benzylidene-p-n-butylaniline (MBBA) and 20 weight percent cholesterol oleyl carbonate (COC). The device active area is about 4 cm$^2$.

An excitation light having a wavelength of about 545 nm and a flux of about $9.2 \times 10^{13}$ photons/cm$^2$-sec incident on the phenoxy side of the device through the indium oxide coated electrode is utilized. After application of the voltage, exposures of about 14 msec pulse duration are given at intervals of about 20 seconds, and the current is measured at each exposure. The first exposure pulse produces a peak current of about $13.5 \times 10^{-6}$ amps which returns to a dark current level of below about $0.1 \times 10^{-6}$ amps within about 100 msec. The second, third, and fourth pulse produce no significant change. However, at the fifth excitation pulse, the dark current after the light excitation begins to show some increase in magnitude and duration prior to returning to a level below about $0.1 \times 10^{-6}$ amps. The sixth excitation pulse produces a significant increase in magnitude and duration of the dark current. This phenomena indicated that each excitation pulse generated trapped electrons at the phenoxy-arsenic triselenide interface which are stable under the applied electric field. Apparently, as more pulsed exposures are given, trapped electrons accumulate at the phenoxy/arsenic triselenide interface; hence the electrical field across the phenoxy insulating layer keeps increasing. Eventually, the electrical field enhancement becomes high enough for the injection of positive charges or holes to become significant. The total negative charge accumulated at the phenoxy/arsenic triselenide interface after the fifth light pulse as calculated from the total charge flow per light pulse in these experiments is found to be about $0.65 \times 10^{-6}$ coulomb/cm$^2$. This value agrees very well with the average critical charge, or total charge of primary current prior to the onset of gain photocurrent or secondary current, noted in Table I above.

These observations and correlations made in this Example IX indicate that the excitation light need not necessarily be continuously impinging on the photoconductive layer prior to onset of secondary current or gain photocurrent, but that pulsed light can be utilized to initiate the onset of gain photocurrent. Mechanistically, the observations and correlations indicate that trapping of charges occurs at the interface between the insulating layer and photoconductive layer.

EXAMPLE X

The imaging device with the imaging layer of Example IX is subjected to a steady relatively low intensity illumination at a wavelength of about 545 nm and at a flux below $10^{12}$ photons/cm$^2$-sec., during the application of about 220 D.C. volts. The intensity of the excitation light is insufficient to produce a gain photocurrent within a few seconds and the primary photocurrent produced is insufficient to cause texture transformation of the cholesteric liquid crystalline layer from the Grandjean texture to the focal-conic texture. The voltage and excitation light are turned off. While the voltage is reapplied, the device is exposed to a strobe light pulse at an incident intensity at about $8 \times 10^{12}$ photons/cm$^2$ pulse at about 545 nm. The intensity of the strobe light pulse is insufficient to produce a gain photocurrent and the primary current produced is insufficient to cause texture transformation of the cholesteric liquid crystalline layer. The voltage is turned off.

The voltage is re-applied and the device is then illuminated with the steady low intensity illumination and the strobe light is pulsed once, the combined illumination providing total incident photons of at least about $9 \times 10^{12}$ photons/cm$^2$. The two exposures together substantially immediately (i.e., within a fraction of a second) generate a gain photocurrent, and the resultant current is sufficiently high to cause a texture transformation in the cholesteric liquid crystalline layer from the Grandjean texture to the focal-conic texture.

EXAMPLE XI

The device and simultaneous exposure of Example X is followed; however, the strobe light pulse is passed through an imagewise configured mask which permits only imagewise configured strobe light to impinge the device. The cholesteric liquid crystalline layer is transformed in texture from the Grandjean to the focal-conic texture in imagewise configuration corresponding to the imagewise configured strobe light impinging the device.

EXAMPLE XII

Example XI is followed except that the steady low intensity illimination is provided in imagewise configuration while the strobe light pulse uniformly impinges the device.

IMPROVED GAIN PHOTOCURRENT

It has now been found that improved gain photocurrent can be obtained by irradiating the photoconductor containing selenium alloy with infrared radiation. It has been found that exposure of the photoconductor containing selenium or a selenium alloy simultaneously to both infrared radiation and excitation light provides an increased maximum gain photocurrent (M.G.P.) and an increased equilibrium gain photocurrent (E.G.P.). It has also been found that fatigue effects resulting from the cyclical operation of the gain photocurrent device can be overcome by irradiating the device with infrared radiation either in between cycles of gain photocurrent production or by continuously irradiating the gain photocurrent device, without interruption, throughout the cyclical operation thereof.

Figure 4:
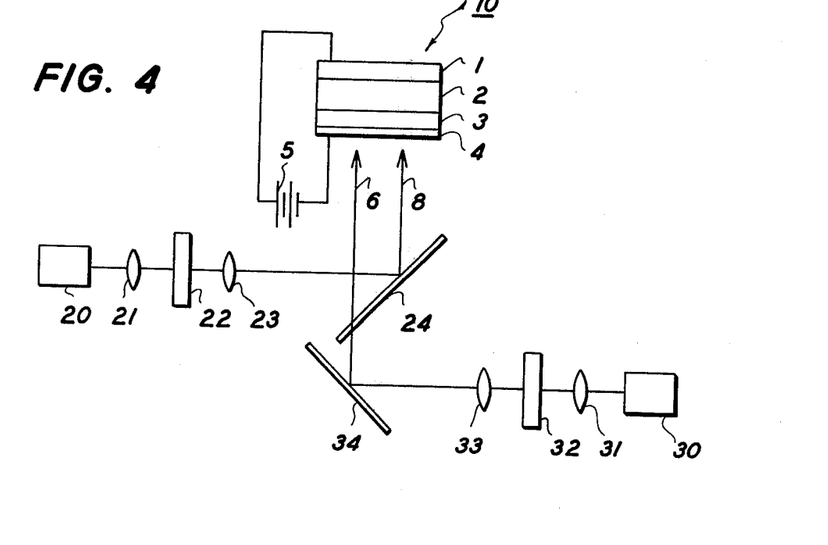
FIG. 4 is a schematic illustration of an embodiment of the present invention.

Referring now to FIG. 4, there is seen a schematic illustration of one embodiment of the present invention which can be utilized to selectively irradiate the gain photocurrent device with infrared radiation. In FIG. 4, like numerals refer to like elements in FIG. 1. As seen in FIG. 4, excitation light source 30 and infrared radiation source 20 provide radiation which, respectively, pass through focusing lens 31 and 21 which focus the radiation through the aperture of shutters 32 and 22. The radiation emerging from the shutters passes through collimating lens 33 and 23. The excitation light from source 30 strikes a silvered mirror 34 which is 100% reflecting and is deflected through semi-transparent mirror 24 which allows approximately 50% of the excitation light 6 to pass therethrough and to strike the gain photocurrent device 10. The infrared radiation 8 from source 20 strikes the semi-transparent mirror 24 which reflects about 50% of infrared radiation 8 onto gain photocurrent device 10.

It will be appreciated, of course, that the optical setup depicted in FIG. 4 is for purposes of illustration only, and that the lenses and shutters are optional. Any suitable source of infrared radiation and any suitable source of excitation light may be utilized. Further, mirrors 34 and 24 are optional and may be dispensed with. In that case, excitation light source 30 and infrared radiation source 20 are appropriately oriented so as to impinge the gain photocurrent device 10. Excitation light 6 may be either uniform or in imagewise configuration, as previously described. Infrared radiation 8 may likewise uniformly impinge gain photocurrent device 10 or be in imagewise configuration. Typically, for gain photocurrent device 10 depicted in FIG. 1, the excitation light and infrared radiation will uniformly impinge device 10 whereas in the imaging layer embodiment of FIG. 3, the excitation light and infrared radiation may either be in imagewise configuration or uniformly impinge the imaging device for the same reasons and under the same conditions as previously described with respect to FIG. 3. For example, if imaging layer 7 in FIG. 3 is in imagewise configuration, then both the infrared radiation and the excitation light can uniformly impinge the imaging device. When imaging layer 7 is not in imagewise configuration, excitation light 6 can be in imagewise configuration and infrared radiation 8 can uniformly impinge the imaging device. In the simultaneous exposure of the present invention, both the excitation light and the infrared radiation may be in imagewise exposure. In the cyclical operation of the imaging device, the infrared radiation need only impinge those areas of the imaging device which are cyclically subjected to excitation light but it is preferred as a matter of convenience to uniformly impinge the imaging device with infrared radiation.

In the embodiment illustrated in FIG. 4. the orientation and disposition of the radiation sources, lenses, shutters and mirrors provide a compact arrangement within an overall device housing and allow for the selective irradiation with infrared radiation so that any of the method embodiments of the present invention can be practiced. In this regard, shutters 32 and 22 are electrically actuated by suitable programming means to provide for the method embodiment of the present invention desired to be practiced. Further, in this regard, lenses 21 and 31 are preferably focusing lenses which ensure the efficient utilization of radiation emanating from sources 20 and 30 by passing substantially all of the radiation emanating therefrom through the shutters. Lenses 23 and 33 are preferably collimating lenses which are adapted to provide parallel rays of radiation and, therefore, greater quality control.

EXAMPLE XIII

The gain photocurrent device of FIG. 1 is prepared in accordance with Example I. The radiation sources and associated optical elements of FIG. 4 are provided and arranged substantially in accordance with the FIG. 4 illustration. Excitation light source 30 is a tunable monochrometer which is adjusted to provide radiation at a wavelength of about 4540A and infrared radiation source 20 is a tunable monochrometer adjusted to provide radiation at a wavelength of about 8000A.

Figure 5A:
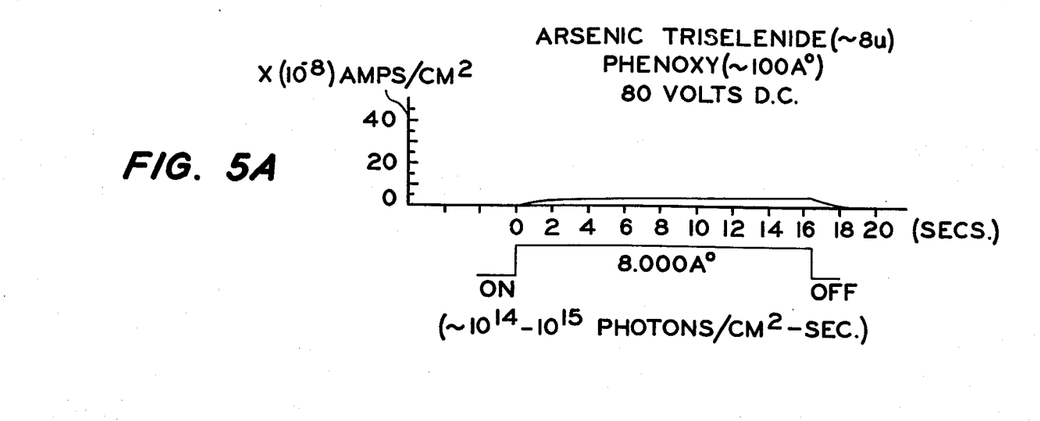
FIGS. 5a–5c is a graphical illustration of the increase in maximum gain photocurrent and of the increase in equilibrium gain photocurrent provided by simultaneous exposure of the photoconductor to infrared radiation and excitation light as compared to infrared radiation alone and excitation alone.

As a first experiment, 80 D.C. volts are applied across the device. During application of the voltage, the about 8000A wavelength radiation is directed upon the device for about 16 seconds. The resulting photocurrent is measured to be about $2 \times 10^{-8}$ amps/cm$^2$. This is depicted in FIG. 5A.

As a second experiment, during re-application of the 80 volts, the about 4540A wavelength radiation is directed upon the device at an intensity of about $10^{11}$ photons/cm$^2$-sec for about 12 sec. The resulting gain photocurrent has a maximum value of about $7.5 \times 10^{-7}$ amps/cm$^2$ which appears about 5 seconds after turn-on of the excitation light and gradually diminishes within about 7 seconds after reaching maximum to a value of about $2 \times 10^{-7}$ amps/cm$^2$. The excitation light is turned off in this point in time and within about 2 seconds the photocurrent drops from $2 \times 10^{-7}$ amps/cm$^2$ to about $1 \times 10^{-7}$ amps/cm$^2$.

As a third experiment, during re-application of the 80 volts, the gain photocurrent device is simultaneously subjected to infrared radiation and the excitation light. The infrared radiation is turned on for about 16 seconds and during the first about 12 seconds thereof the excitation light simultaneously impinges the device. The infrared radiation is at a wavelength of about 8000A and the excitation light is at a wavelength of about 4540A. After about 5 seconds from the simulatneous turn-on infrared radiation and excitation light, the gain photocurrent reaches a maximum value of about $1.05$ times $10^{-6}$ amps/cm$^2$. About 3 seconds after reaching its maximum, the gain photocurrent under the simultaneous exposure of infrared radiation and excitation light decreases to a plateau gain photocurrent level (equilibrium gain photocurrent) of about $5.8 \times 10^{-7}$ amps/cm$^2$ until the excitation light is extinguished. During the remainder about 4 seconds during which the infrared radiation alone impinges the device, the photocurrent decreases down to a value of about $1.7 \times 10^{-7}$ amps/cm$^2$.

Example XIII demonstrates that when infrared radiation is superimposed over excitation light, there results an enhancement of gain photocurrent in that the maximum gain photocurrent is significantly increased; and, there results an enhancement of equilibrium gain photocurrent in that the magnitude of the equilibrium gain photocurrent is increased and the duration of equilibrium gain photocurrent is increased. These effects are significant for many reasons, principally because a greater maximum gain photocurrent will in many imaging embodiments be sufficient to substantially instantaneously provide the imaging effect sought in imaging layer 7 of FIG. 3 and in other cases the magnitude and duration of the equilibrium gain photocurrent will be sufficient to achieve either the same or other imaging effects desired in imaging layer 7 of FIG. 3.

Figure 5B:
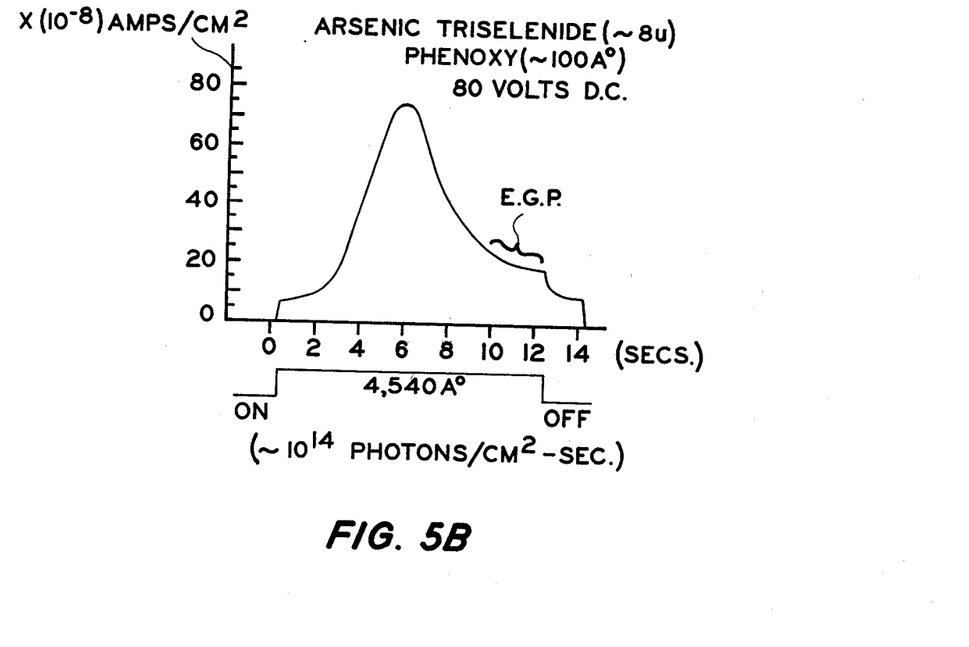
Figure 5C:
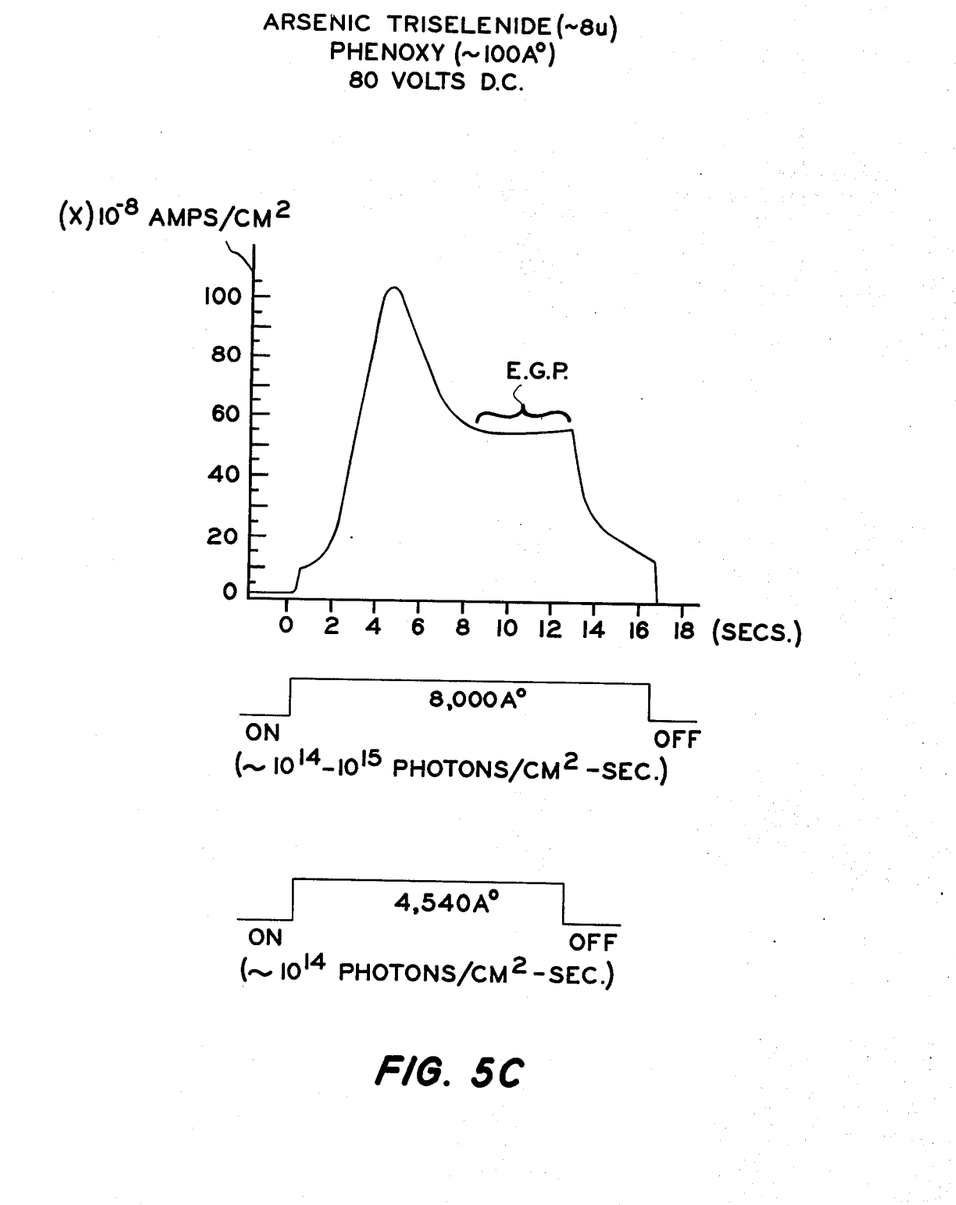

Visual comparison of the three experiments in Example XIII readily indicate the significance of simultaneous infrared and excitation light exposure. The three experiments are respectively graphically illustrated in FIGS. 5A, 5B, and 5C.

As has been noted above, the cyclical operation of the gain photocurrent device in FIG. 1 typically results in a decreasing amount of gain photocurrents. The fatigue effects and beneficial results provided by another embodiment of the practice of the present invention is demonstrated in Examples XIV and XV and graphically illustrated in FIGS. 6 and 7, respectively.

EXAMPLE XIV

Example XIII is repeated to the extent of providing the embodiment of FIG. 4. The excitation light is at a wavelength of about 4540A and its intensity upon the device is at about $2 \times 10^{11}$ photons/cm²-sec. During each cycle the voltage is applied and during application of the voltage the device impinges with excitation light. In between cycles the applied voltage is turned off. During the first cycle, a maximum gain photocurrent of about $5.25$ times $10^{-7}$ amps/cm² is obtained; during the second cycle, a maximum gain photocurrent of about $2.5 \times 10^{-7}$ amps/cm² is obtained; during the third cycle, a maximum gain photocurrent of about $2 \times 10^{116\ 7}$ amps/cm² is obtained; and, during the fourth cycle, a maximum gain photocurrent of about $1.5 \times 10^{-7}$ amps/cm² is obtained. This result is graphically illustrated in FIG. 6.

EXAMPLE XV

Example XIII is followed to the extent of providing the embodiment of FIG. 4. The excitation light is at about 4540A but its intensity upon the device is about ½ that of Example XIV, or at about $10^{11}$ photons/cm²-sec. The device is cycled by turning on the applied voltage of 80 D.C. volts and during application of such voltage impinging the device with excitation light, and then turning off the voltage. Each cycle is separated by about 20 seconds interval during which the voltage and excitation light remain off. During the about 20 seconds interval, the infrared radiation at about 8000A wavelength and at an intensity of about $10^{14}$ photons/cm²-sec uniformly impinges the device. The results obtained are graphically illustrated in FIG. 7. The maximum gain photocurrent is increased by about 50% and is consistently reproduced during each cycle. This is graphically illustrated in FIG. 7.

Figure 6:
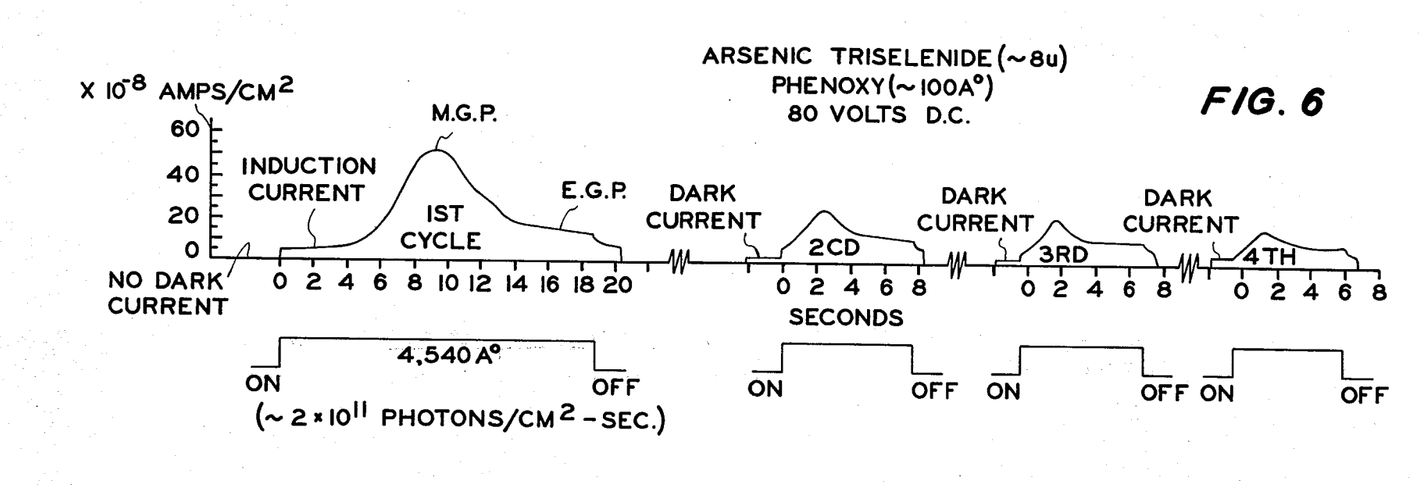
FIG. 6 is a graphical illustration of the fatigue effect during cyclical operation of a gain photocurrent device in the absence of the practice of the present invention.
Figure 7:
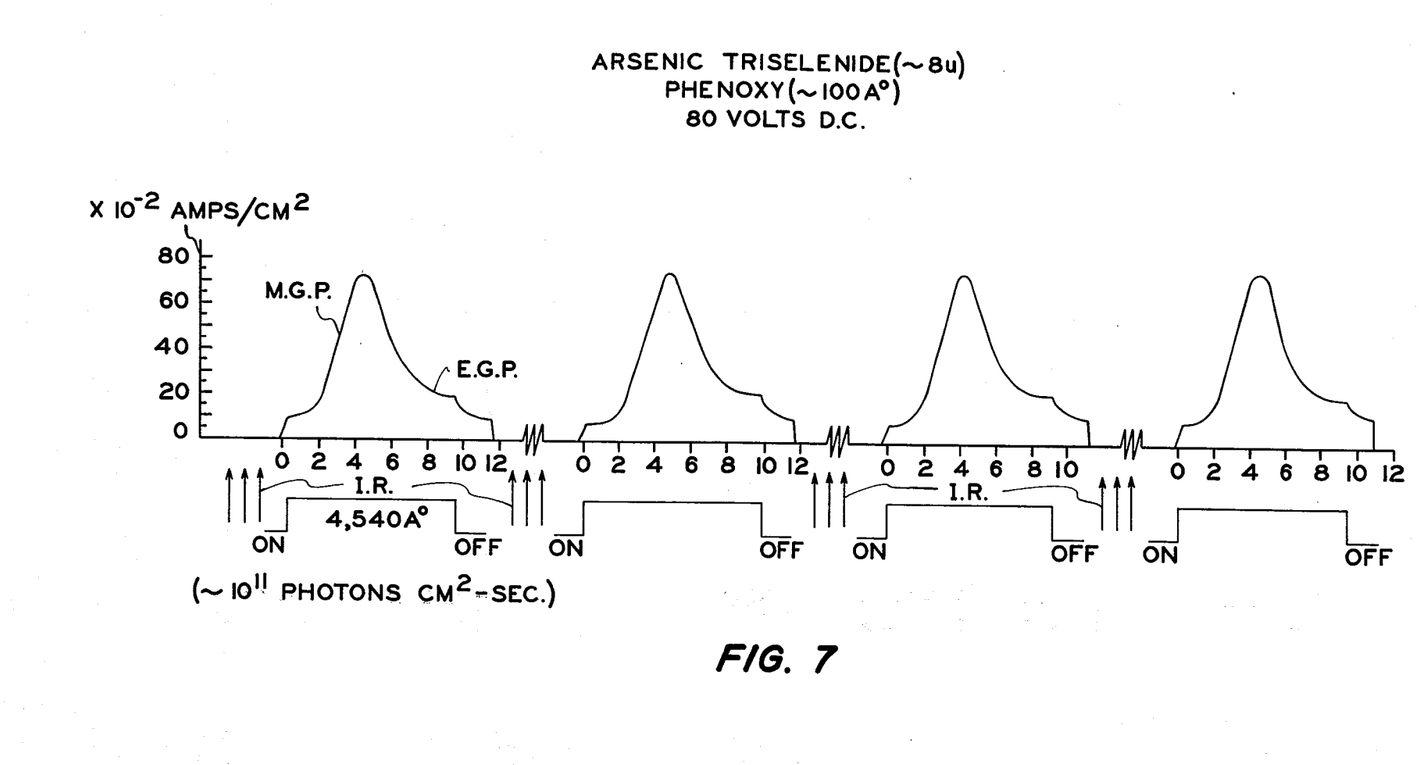
FIG. 7 is a graphical illustration of the consistently good results obtained during cyclical operation of the gain photocurrent device in accordance with the practice of the present invention.

A comparison of FIG. 6 to FIG. 7 shows that the dark current in FIG. 6 steadily rises in magnitude in successive cycles whereas in FIG. 7 the dark current remains substantially at the same low magnitude. This demonstrates that consistent reproducible and desired enhancement of gain photocurrent is provided in accordance with the practice of the present invention.

It will be appreciated, of course, that the intensity and duration of exposure of the device to infrared radiation are parameters which are interrelated. That is, for example, for any given wavelength of infrared time required to obtain the beneficial results of the practice of the present invention. Conversely, the less the intensity for any particular wavelength of infrared radiation utilized, the greater the duration of exposure. Further, it will be appreciated by those skilled in the art that the particular wavelength or wavelengths of infrared radiation utilized in any particular device will depend on the nature and identity of the photoconductor comprising selenium or a selenium alloy. For example, for arsenic triselenide it has been experimentally determined that infrared radiation within the wavelength band of from about 7000A to 8500A is preferred. For an intensity of about $10^{14}$ to about $10^{16}$ photons/cm²-sec of infrared radiation within that wavelength band, an optimum exposure time is deemed to be from about 0.1 to about 20 sec. Optimum wavelengths for each different photoconductor comprising selenium or selenium alloy can be easily and conveniently determined by utilizing the embodiment of FIG. 4 and utilizing a tunable monochrometer. For simultaneous embodiments of the present invention, the wavelength or wavelength band of infrared radiation which consistently provides a maximum gain photocurrent and maximum equilibrium photocurrent in comparison to the excitation light alone such as, for example, the comparison of FIG. 5C to FIG. 5B will indicate the optimum infrared radiation wavelength. In the cyclical operation of the gain photocurrent device, the optimum infrared radiation wavelength or wavelength bands to be utilized with any particular photoconductor containing selenium or a selenium alloy can be similarly determined to be that which produces the maximum gain photocurrent in a reproducible manner such as depicted in FIG. 7.

While preferred embodiments of the practice of the present invention have been described above, it will be appreciated, of course, that the infrared radiation may be directed through either side of the gain photocurrent device. As previously mentioned above, all elements of the gain photocurrent device through which either the infrared radiation of the excitation light pass should be at least semi-transparent to such radiation or light. The infrared radiation and the excitation light need only strike the photoconductor within the gain photocurrent device and need not pass through the device.

It will be appreciated by those skilled in the art that the infrared radiation may be directed continuously upon the gain photocurrent device throughout its operation. Or, the infrared radiation may be utilized solely during intervals between cycles of gain photocurrent production such as is illustrated in FIG. 7. Or, the infrared radiation may be utilized simultaneously with excitation light exposure. In the simultaneous embodiment, the infrared radiation exposure need not be identically coextensive in time with the excitation light exposure, it being sufficient that there be some overlap of the two exposures. Preferably, the time duration of overlap is sufficient to provide maximum gain photocurrent and maximum equilibrium gain photocurrent magnitude and duration for the particular intensity of infrared radiation utilized.

It will be appreciated that other variations and modifications will occur to those skilled in the art upon a reading of the present disclosure. These are intended to be within the scope of this invention.

What is claimed is:

1. The method of providing gain photocurrent, comprising:
   a. providing between two electrodes, an insulating layer in contact with a photoconductive layer comprising selenium or selenium alloy, the thickness ratio of photoconductive layer to insulating layer being at least about 10 to 1;
   b. applying a D.C. voltage across said photoconductive and insulating layers;
   c. impinging said photoconductive layer with light having a wavelength within the fundamental absorption band of the selenium or selenium alloy within said photoconductive layer and which excites a primary current within said photoconductive layer; and
   d. impinging said photoconductive layer with infrared radiation.

2. The method of claim 1 wherein said insulating layer comprises an insulating material having an ionization potential less than about 8 eV.

3. The method of claim 1 wherein at least one of said electrodes comprise a material having a work function greater than about 4.5 eV.

4. The method of claim 3 wherein said at least one electrode is adjacent said insulating layer.

5. The method of claim 4 wherein said at least one electrode comprises a material selected from the group consisting of platinum, copper, gold, tin oxide, and indium oxide.

6. The method of claim 2 wherein said insulating layer comprises an insulating mateiral selected from the group consisting of phenoxy resin, poly(2-propeneanthracene), poly(2-vinyl-anthracene) and poly[1-(2-antrile)ethylmethylacrylate].

7. The methord of claim 1 wherein the step of impinging said photoconductive layer with infrared radiation is performed simultaneously with the performance of step (c).

8. The method of claim 1 wherein said photoconductive layer comprises arsenic triselenide.

9. The method of claim 8 wherein said infrared radiation has a wavelength from about 7000A to about 8500A.

10. The method of claim 9 wherein said infrared radiation has an intensity of from about $10^{14}$ to about $10^{16}$ photons/cm$^2$-sec.

11. The method of claim 10 wherein said infrared radiation impinges said photoconductive layer for a period of time from about 0.1 to about 20 seconds.

12. The method of claim 1 further including the step of removing the voltage applied in step (b) subsequent to the performance of step (c) and prior to the performance of step (d).

13. The method of claim 1 wherein the performance of said step (d) is continuously performed over a predetermined period of time, further including, during said predetermined period of time the performance of steps (a), (b) and (c) at least one time.

14. The method of claim 13 wherein said predetermined period of time is sufficient for the performance of steps (a) through (c), in sequence, at least twice; further including the performance of steps (a) through (c), in turn, at least twice.

15. The method of imaging comprising:
   a. providing between two electrodes a photoconductive layer comprising selenium or a selenium alloy and sandwiched between an insulating layer and an imaging layer, the ratio of photoconductive layer thickness to insulating layer thickness being at least about 10 to 1, said imaging layer comprising material having at least one optical property which undergoes change when said material is subjected to an applied voltage.
   b. applying a D.C. voltage across said insulating, photoconductive and imaging layers;
   c. impinging imagewise said photoconductive layer with light having a wavelength within the absorption band of photoconductive material within said photoconductive layer and for a period of time wherein gain photocurrent is obtained; and
   d. impinging said photoconductive layer with infrared radiation.

16. The method of claim 15 wherein said imaging layer is photochromic.

17. The method of claim 15 wherein said impinging layer comprises a material selected from the group consisting of nematic liquid crystalline materials, cholesteric liquid crystalline materials and mixtures thereof.

18. The method of claim 17 wherein said imaging layer comprises about 80% by weight p-methoxy-benzilidene-p-nbutylaniline and about 20% by weight cholesterol oleyl carbonate.

19. The method of claim 15 wherein said photoconductive layer comprises arsenic triselenide.

20. The method of claim 19 wherein the electrode adjacent the insulating layer comprises a material having a work function greater than about 4.5 eV.

21. The method of claim 20 wherein the electrode adjacent the insulating layer comprises a material selected from the group consisting of platinum, copper, gold, tin oxide and indium oxide.

22. The method of claim 20 wherein said insulating layer has an ionization potential less than about 8 eV.

23. The method of claim 20 wherein said infrared radiation comprises radiation having a wavelength from about 7000 to about 8500 A.

24. The method of claim 23 wherein said infrared radiation has an intensity of about $10^{14}$ to about $10^{16}$ photons/cm$^2$-sec.

25. The method of claim 24 wherein said infrared radiation impinges said photoconductive layer for a period of time from about 0.1 to about 20 seconds.

26. The method of claim 15 further including the step of removing the voltage applied in step (b) subsequent to performance of step (c) and prior to performance of step (d).

27. The method of claim 15 wherein said step (d) is performed simultaneously with the performance step (c).

28. The method of claim 15 wherein in step (c) said light impinging said photoconductive layer comprises light from at least two sources, at least one of which is in imagewise configuration, the superimposition of the light from one source with that from the other source being sufficient to substantially immediately initiate gain photocurrent, and the light from each source along being insufficient to substantially immediately initiate gain photocurrent.

29. The method of claim 15 wherein the performance of said step (d) is continuously performed over a predetermined period of time, further including, during said predetermined period of time the performance of steps (a), (b) and (c) at least one time.

30. The method of claim 29 wherein said predetermined period of time is sufficient for the performance of steps (a) through (c), in sequence, at least twice; further including the performance of steps (a) through (c), in turn, at least twice.

* * * * *

UNITED STATES PATENT AND TRADEMARK OFFICE
CERTIFICATE OF CORRECTION

PATENT NO. : 3,939,346
DATED : February 17, 1976
INVENTOR(S) : Simpei Tutihasi

It is certified that error appears in the above–identified patent and that said Letters Patent are hereby corrected as shown below:

Column 1, line 9: "photoconductive" should read --photoconductor--.

Column 7, line 64: "fieldeffects" should read --field-effects--.

Column 13, line 34: "pmethoxy-" should read -- p-methoxy- --.

Signed and Sealed this

Tenth Day of August 1976

[SEAL]

Attest:

RUTH C. MASON
*Attesting Officer*

C. MARSHALL DANN
*Commissioner of Patents and Trademarks*